United States Patent [19]

Blais et al.

[11] Patent Number: 5,044,072
[45] Date of Patent: Sep. 3, 1991

[54] VISION SYSTEM APPARATUS AND METHOD FOR COMPONENT/PAD ALIGNMENT

[75] Inventors: Bruno Blais; Urs Berger, both of Solothurn, Switzerland

[73] Assignee: Air-Vac Engineering Company, Inc., Milford, Conn.

[21] Appl. No.: 509,593

[22] Filed: Apr. 13, 1990

[51] Int. Cl.$^5$ ............................................. H05K 3/30
[52] U.S. Cl. ........................................ 29/834; 29/759; 29/833; 228/4.5; 250/225; 356/400
[58] Field of Search ................. 29/720, 721, 833, 759; 356/400, 375; 228/4.5; 250/225

[56] References Cited

U.S. PATENT DOCUMENTS

| | | | |
|---|---|---|---|
| 3,581,375 | 6/1971 | Rottmann | 356/400 X |
| 4,286,201 | 8/1981 | Roecks et al. | 356/400 X |
| 4,628,464 | 12/1986 | McConnell | 29/759 X |
| 4,671,446 | 6/1987 | Sherman | 228/4.5 |
| 4,793,707 | 12/1988 | Hata et al. | 356/375 |
| 4,813,588 | 3/1989 | Srivastava et al. | 29/833 X |
| 4,867,569 | 9/1989 | Mohara | 29/759 X |
| 4,937,459 | 6/1990 | Ina | 250/225 X |

OTHER PUBLICATIONS

IBM Tech. Discl Bull., vol. 25, No. 5, Oct. 1982, pp. 2301-2303 by Gaston.

Primary Examiner—Carl J. Arbes
Attorney, Agent, or Firm—Perman & Green

[57] ABSTRACT

An improved method and apparatus for the visual alignment and placement of electrical components, such as lead-carrying chip members, and pad members, such as pad-carrying printed circuit boards, for purposes of aligning, placing and soldering said leads to said pads. The method involves supporting the chip member vertically over said pad member, inteposing therebetween a beam splitter cube which provides a simultaneous view of the underside of the chip member and the surface of the pad when viewed through a stereo microscope means, interposing an adjustable polarizing filter means which permits the operator to adjust the visual contrast between the leads and the pads, thereby facilitating the proper X, Y and theta vertical alignment, and moving the component down onto the pad member for soldering thereto.

13 Claims, 2 Drawing Sheets

VISION SYSTEM APPARATUS AND METHOD FOR COMPONENT/PAD ALIGNMENT

BACKGROUND OF THE INVENTION

The present invention relates to an improved method and apparatus for the vertical registration or alignment of electrical components, such as multi-lead chip members, over pad areas of receptor members such as printed circuit boards, each said pad area comprising a contact area designed to be contacted with and soldered to one of said leads to integrate the chip member into the printed circuit loop.

It is known to provide vision system devices for supporting multi-lead chip members vertically over pad members and for interposing a beam splitter cube therebetween for purposes of viewing and aligning the underside of the chip member with the surface of the pad member, such viewing being done through a solid state camera and monitor system providing a video screen image. Such known devices have been commercially-available under the trademarks Model 4460 M Rework Station available from Semiconductor Equipment Corp., Moorpark, CA, Conceptronic Rover, Explorer and Caps Pick and Place Systems available from Conceptronic, Exeter, NH.

While such systems and devices are designed for the same purposes as the present systems, they have the disadvantage of providing video screen images of the chip member and the pad member to the operator for purposes of facilitating adjustment of the X, Y, theta and Z axes for alignment. Such video images are of relatively poor quality, sharpness and fixed contrast, which makes it difficult for the operator to visually distinguish between the leads and the pad areas, particularly in cases where there is a color contrast between the component and the pad member.

It is also known to provide vision system devices which give the operator a direct three dimensional view of the underside of the component and the surface of the pad member through a beam splitter cube and a stereo microscope means, for the present purposes. Reference is made to the Model DRS-22 Surface Mount System available from Air-Vac Engineering Company, Inc., Milford, CT, the present applicant. While such devices provide a superior stereo view of the component and the pad to the operator for alignment purposes, they do not permit any adjustment of the visual contrast between the component and the pad member, which makes it difficult for the viewer to distinguish between the component and the pad member, particularly in cases where there is a color contrast therebetween. Also the view provided to the operator varies significantly with the ambient light even though the apparatus incorporates external small halogen-type lamp source, the light from which illuminates both the component and the circuit board. Such light variations are dependent upon the location of the apparatus and upon variations of the ambient light even when the apparatus is only used in a single location.

SUMMARY OF THE INVENTION

The present invention provides a new and improved method and apparatus for facilitating the perfect registration or alignment of a multi-lead component and a multi-pad receptor area, such as of a printed circuit board, in which the operator has a stereo view of the underside of the component and the surface of the pad member through a microscope and through an interposed beam splitter cube, characterized by the latter having an integral adjustable polarizing filter at the underside thereof which enables the viewer to adjust the visual contrast of the pad member, darkening it or lightening it to produce the best possible visual contrast between the leads or contact feet of the component and the pads or receptor contact areas of the pad member or board, for purposes of improving the visual alignment ability and accuracy by the operator.

According to a preferred embodiment of the present invention, the beam splitter cube is also provided with integral lighting means, preferably fiber optic lighting means, for providing a constant and intense direct illumination of the underside of the component and the receptive surface of the pad member, and surrounding the z-axis therebetween.

According to another preferred embodiment of the invention, the beam splitter cube is also provided with a means for sensing the plane of the undersurface of a multi-lead component adjustably supported thereabove for purposes of regulating and unifying the supported location of said plane regardless of differences in the thickness of the component, whereby the distance between the component and the surface of the pad member during alignment is always the same regardless of the thickness of the component. Verifying the distance in both optical paths through the stereo microscope and beam splitter cube gives an image of uniform viewing clarity.

The other essential and conventional features of the present apparatus and method comprise a means for releasably holding the multi-lead component in vertical elevation above the pad member and for moving the aligned component downwardly along the z-axis into contact with the pad member; means for supporting the pad member and for adjusting it in the X, Y and theta (rotational) directions for alignment with the multi-lead component supported thereabove; means for extending the beam splitter cube to a set position along the z-axis between the component and the pad member for alignment purposes, and for retracting the cube to permit movement of the aligned component down along the z-axis onto the stationary pad member, referencing the placement by means of an indicator scale, and heating means for causing the reflow of solder present on the multiple pads of the pad member while in contact with the aligned leads of the multi-lead component, to produce electrical interconnection therebetween.

THE DRAWINGS

DETAILED DESCRIPTION

Figure 1:
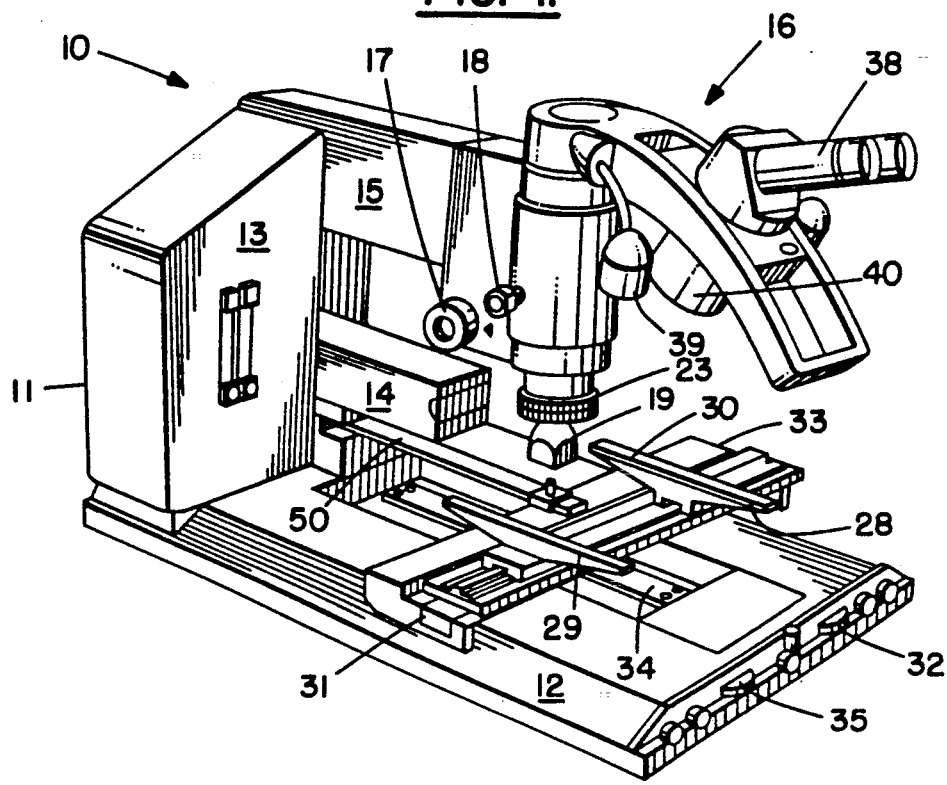
FIG. 1 is a perspective view of an apparatus for electrical component/pad alignment, which is modified according to an embodiment of the present invention.

Referring to the apparatus 10 of FIG. 1, said apparatus, as illustrated, is identical in outward appearance and function to the prior-known Surface Mount System apparatus DRS-22 referred to hereinbefore. The essential differences reside in the beam splitting cube assembly and are only apparent when said assembly is extended and used.

The general apparatus 10 of FIG. 1 comprises a housing 11 including a supporting base 12, a rear upright housing member 13 containing a pneumatic system and supporting a beam splitting cube housing 14 and a nozzle member support 15, both in horizontal extension therefrom overlying the supporting base 12. A heater head and nozzle assembly 16 is connected to the end of the support 15 by means of precision guide pins. The heater head and nozzle assembly 16 ride along precision guide shafts and bushings for adjustable vertical movement along the z-axis by means of a vertical adjustment knob 17 and for rotation adjustment by means of knob 18.

Figure 2:
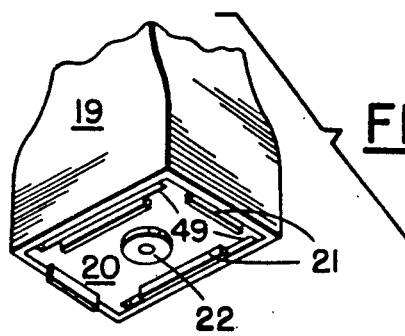
FIG. 2 is a perspective view illustrating the manual insertion or removal of an electrical component relative to the vacuum nozzle of the apparatus of FIG. 1.

The assembly 16 comprises internal heating and vacuum means, an interchangeable lower gas nozzle 19 having a component-receiving cavity 20, shown in FIG. 2, including component-piloting means 21 and a vacuum orifice 22. The assembly 16 also includes a releasing ring 23 which spreads or closes a clamping finger means thereof to release or engage a nozzle 19. As illustrated by FIG. 2, a component 24 preferably is manually inserted into or removed from the nozzle pilots 21 by means of a hand-held vacuum probe 25 to prevent physical contact with the leads. Once inserted the component is secured within the nozzle pilots 21 by the internal vacuum through orifice 22. Removal of a component 24 from the cavity 20 is accomplished by applying the manual vacuum probe 25 to the underside thereof, generating a vacuum therein and discontinuing the vacuum through orifice 22, and manually withdrawing the component with the probe. Alternatively a component holding tray can be used instead of the vacuum probe.

Figure 3:
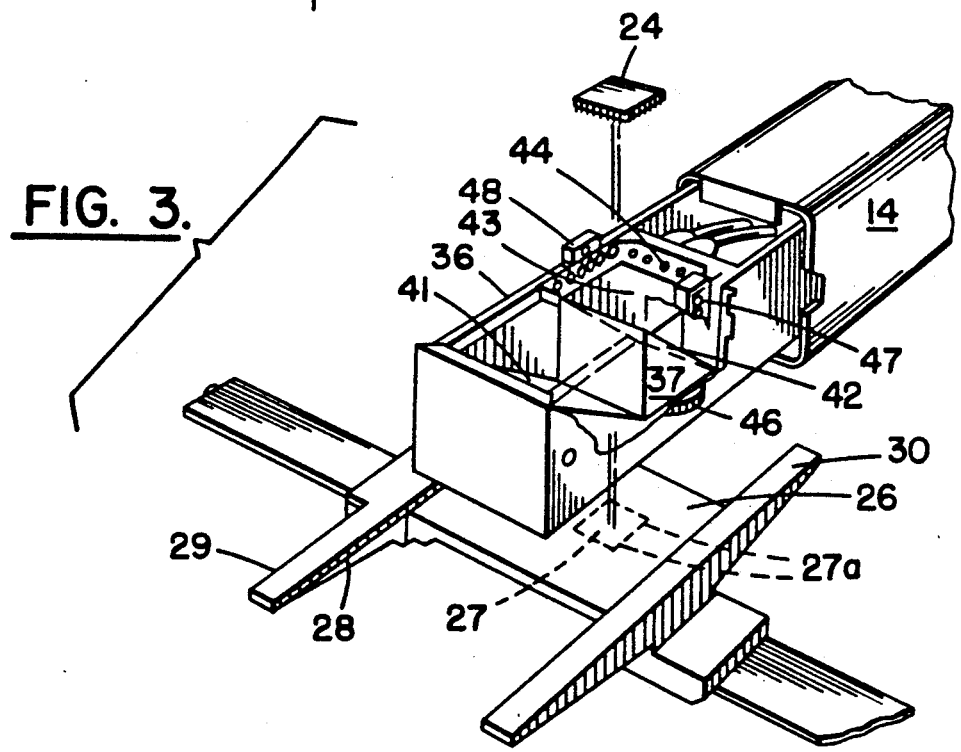
FIG. 3 is a perspective view of the extended beam splitting cube assembly, shown in retracted position in FIG. 1, positioned along the z-axis during alignment between an electrical component supported overhead (in a vacuum nozzle, not shown) and a receiving pad member of a printed circuit board supported therebelow in an adjustable carriage member.

Alignment is accomplished by clamping a circuit board 26 having a receptive pad member 27 within the receptive facing slots 28 present on the inside surfaces of spring-loaded carrier arms 29 and 30 as shown in FIG. 3. The arms 29 and 30 are commonly-supported on a member engaged within a track 31 for adjustable movement in the x-direction by turning the fine x-adjustment control wheel 32 at the front of the apparatus. The track 31 is present on a carriage member 33 supported within a track 34 for adjustable movement in the Y-direction by turning the fine Y-adjustment control wheel 35 at the front of the machine.

When an electrical component 24 is secured within the nozzle 19 and a PCB 26 is secured between the clamping arms 29 and 30, adjustment and alignment thereof is accomplished by sliding the beam-splitting cube member 36 out of its housing 14 to a stop position in which the beam-splitting cube 37 thereof is centered along the z-axis between the overhead component 24 and the receptive pad member 27 of the PCB 26 thereunder. The operator has a simultaneous three-dimensional view of the underside of the component 24 and the top side of the PCB 26, as they are superimposed and viewed through the stereo microscope 38 adjustably mounted on the nozzle member 16. External illumination is provided by halogen lamps 39 connected to the heater/nozzle assembly 16, and an adjustable focus lens 40 is provided on the microscope.

Figure 4:
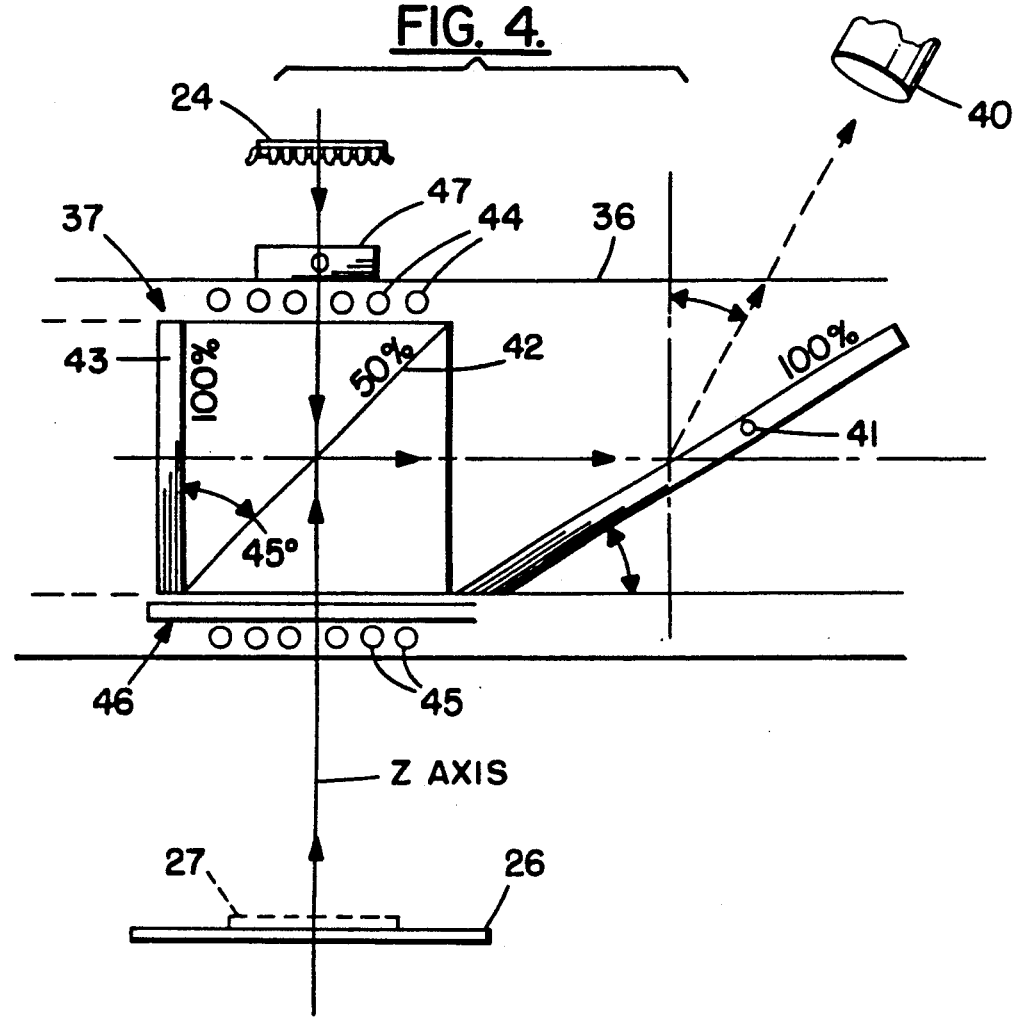
FIG. 4 is a partial cross-sectional view of the extended beam splitting cube of FIG. 3, illustrating the present vision system including the upper and lower fiber optic means, the polarizing filter and the electric eye positioning means.

The view through the microscope 40, as illustrated by FIG. 4, is focused against the primary mirror 41 of the optic frame 36 which reflects superposed images of the component 24 and the pad member 27 of the PCB. The view of the underside of the component 24 is reflected by the upper surface of a 50% diagonal mirror 42 and then projected against a vertical 100% rear mirror 43 of the beam splitting cube section 37 and said reflection is viewed through the 50% mirror 42 and reflected by the primary mirror 41 as illustrated by FIG. 4. The image strength of the component is 25% overall. The view of the top side of the PCB 26 is reflected by the under surface of the 50% mirror 42, which surface is viewed through the primary mirror 41. The image strength of PCB is 50% overall. A polarizing filter cuts this intensity to 25% overall, creating equal image strength. The heater/nozzle assembly 16 is rotated slightly, if necessary, to produce rotational alignment by turning knob 18. Adjustments along the X and Y axes are made to produce perfect registration alignment between each of the leads 24a of the component 24 and each of the individual corresponding pads 27a of the pad member 27 to which the leads are to be soldered. Generally all of these features and functions are present in the prior known surface mount system apparatus disclosed hereinbefore.

The improvements provided by the novel vision system of the present invention are accomplished through modifications in the beam splitting cube section 37 of the optic frame 36. Such modifications include upper fiber optic lighting means 44 surrounding the z-axis for the direct illumination of the underside of the overhead electrical component 24 and of the leads 24a thereof; lower lighting means 45 surrounding the z-axis for the direct illumination of the top surface of the pad member 27 and the pad areas 27a thereof, and an interposed adjustable polarizing light filter ring 46 mounted across the z-axis, which polarizes the image of the pad member 27 and is rotatably mounted to enable light contrasts to be adjusted in the visible reflection of the pad member as viewed by the observer, whereby the reflection of the pad areas 27a can be lightened or darkened to produce a clearer visual contrast between the superimposed reflections of the component leads 24a and of the pad areas 27a. This enables the operator to make a more precise alignment of the leads 24a in centered position with the pad areas 27a whereas, in the prior known apparatus, the lighting of each of these elements was indirectly reflected from the external type lamps 39, and the superimposed reflections of the leads 24a and the pad areas 27a were of equal contrast and appearance. This made precise alignment very difficult, particularly in the case of colored printed circuit boards 27 having background areas similar in color to the color of the pad areas 27a.

Most preferably the cube section 37 of the cube member includes both upper and lower lighting means 44 and 45. The preferred lighting means 44 and 45 comprise fiber optic elements mounted around the housing of the cube section 37 and surrounding the z-axis, which elements have been found to produce a uniform intense illumination of both the component 24 and the pad member 27.

The polarizing filter ring 46 comprises a polarizing filter lens laminated to an anti-reflection glass and mounted within a peripheral ring which, in turn, is rotatably mounted within the housing of the cube section 37, above the lower lighting means 45.

Figure 5:
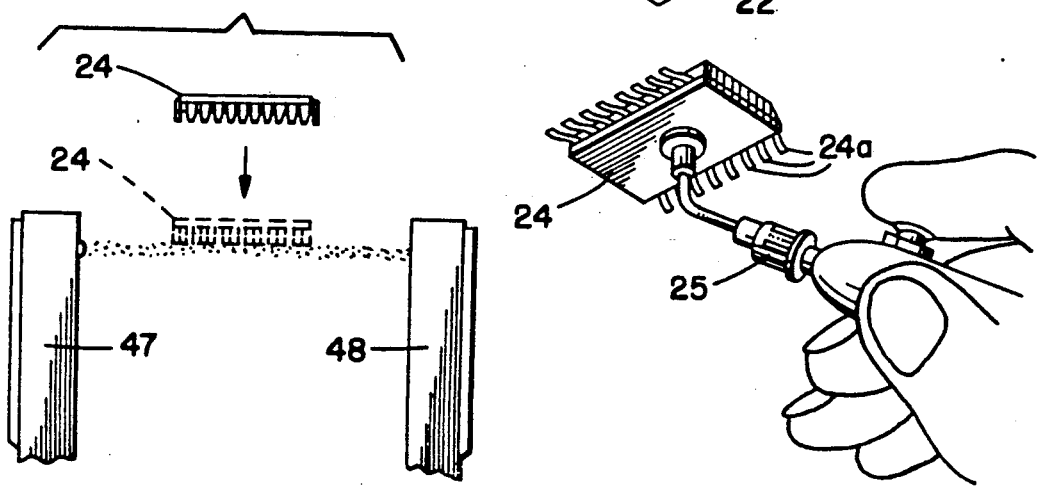
FIG. 5 is a magnified side view of the electric eye positioning means of the cube of FIG. 4.

A final modification of the prior known beam-splitting cube sections comprises opposed component position sensors 47 and 48 mounted at the upper portion of the housing of the cube section 37, on opposite sides of the z-axis, for sensing the precise vertical location of the undersurfaces of the leads 24a of the supported component 24 along the z-axis. In the illustrated embodiment of FIGS. 3 to 5, the sensor 47 is a light emitter or sender and the sensor 48 is a light receiver to provide an electric eye beam across the z-axis at a precise fixed position relative to the focal point of the diagonal mirror 42 of the cube section 37. When the light beam is initially interrupted an LED is activated to indicate the precise positioning of the leads 24a. This is important since any apparatus of the present type has a plurality of different component fixturing devices, i.e., nozzle housings 19 of different sizes to accommodate the containment of electrical components 24 of different sizes and shapes and thicknesses. Thus a single alignment top position for the heater/nozzle assembly 16 is not possible without resulting in variations in the distance between the supported component 24 and the focal point of the diagonal mirror 42. The present position sensors 47 and 48 provide a means for accurate uniform positioning of all components 24 regardless of their thickness or of the depth of the nozzle housing 19 in which they are supported.

The foregoing modifications of the vision system of an alignment apparatus for component leads and pad areas to which they are being soldered enables the alignment step to be conducted more precisely, more quickly and more comfortably by an operator, reducing eye strain and guesswork. Moreover the resultant individual solder connections are more perfect, thereby preventing the inadvertent connection of more than one lead to each pad area or more than one pad area to each lead, with resultant failure.

The soldering step is accomplished in conventional manner, such as by pre-printing each area with solder deposit, and applying sufficient heat to reflow the solder after the alignment is finished, the cube element 37 is pushed horizontally back into its housing 14, and the heater/nozzle assembly 16 is moved downwardly by turning adjustment knob 17 until the leads 24a contact the pad areas 27a. The alignment devices of the present type include upper and lower heating means, the upper heating means comprising a heated air means within the nozzle member 16 for expelling heated air through slots 49 present at the undersurface of nozzle housing 19, as shown in FIG. 2, and the lower heating means 50 comprising a heated air-expelling conduit which underlies the pad member on the printed circuit board, as shown by FIG. 1. Thus the component leads and pads can be heated and reflowed from the top side, and the pad member can be pre-heated, and/or heating can be applied after the positioning of the component on the pad member.

The present apparatus is also used for the removal of defective components from a PCB, whereby the heater/nozzle assembly 16, carrying an empty nozzle housing 19 of the required size, is adjusted downwardly over the component, heat is applied to remelt the solder connections, vacuum is activated and the heater/nozzle assembly 16 is moved upwardly to lift the component away from the PCB, the component being held within the nozzle housing 19 by the vacuum through orifice 22.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

We claim:

1. In the method for the alignment and soldering of leads of an electrical component and the pad members of a printed circuit board to which said leads are to be soldered, comprising supporting a said electrical component in vertical elevation, along the z-axis above said printed circuit board, supporting said printed circuit board in horizontal position along said z-axis below said component on a carriage member which is adjustable along the X and Y directions, interposing a beam splitter cube along said z-axis between said electrical component and said printed circuit board for simultaneously splitting and reflecting an image, passed therethrough along a predetermined image path, against the undersurface of said electrical component and against the pad members on the upper surface of said printed circuit board to provide a simultaneous superimposed view thereof which can be aligned by adjustments of said carriage member in the X or Y directions, observing said superposed view through a microscope means along said predetermined path; making adjustments of said carriage member along the X and Y axes to obtain alignment, adjusting the theta position of said electrical component, and lowering said component vertically along said z-axis to place it into surface contact with the pad members of said printed circuit board with which it has been aligned, and soldering said leads to said pad members, the improvement which comprises interposing an adjustable polarizing filter horizontally across said z-axis, between said electrical component and said printed circuit board to filter the light reflected view of said pad members of the printed circuit board, and said adjusting said filter to vary the intensity of said light reflected view to produce a greater visual contrast between the leads of said electrical component and the pad members of said printed circuit board.

2. The method according to claim 1 which comprises rotatably mounting said polarizing filter in said beam splitter cube at a location below said predetermined light path and filtering the light reflected view of the pad members of said printed circuit board.

3. The method according to claim 1 characterized by providing said beam splitter cube with light means surrounding said z-axis for directly illuminating said electrical component and/or the pad members on said printed circuit board.

4. The method according to claim 3 which comprises providing banks of fiber optic light means above and below said predetermined light path for directly illuminating both said component and said pad members.

5. The method according to claim 1 characterized by sensing the desired elevation position of said electrical component along the Z-axis relative to said beam splitter cube and producing a sensible indication thereof prior to making adjustments of said carriage member in the X and Y directions.

6. The method according to claim 2 which comprises providing an electric eye beam across said Z-axis at a predetermined uniform elevation relative to said beam splitter cube, and sensing the location of the base of said electrical component as it is lowered along said Z-axis towards said beam splitter cube.

7. In an apparatus for the alignment of the leads of an electrical component and the pad members of a printed circuit board to which said leads are to be soldered, comprising component support means for supporting a said electrical component in vertical elevation above, and for moving a said component along the z-axis into contact with a said printed circuit board, carriage means for supporting a said printed circuit board in horizontal position along said z-axis below said component support means, means for adjusting said carriage means along the X, Y and theta directions, a beam splitter cube adjustably mounted to be interposed along said z-axis between said component support means and said carriage means for simultaneously splitting and reflecting images, passed therethrough along a predetermined image path, against the undersurface of a component supported by said component support means and against the pad members on the upper surface of a printed circuit board supported by said carriage member to provide a simultaneous superposed view thereof which can be aligned by adjustments of said carriage member in the X, Y and theta directions, microscope means enabling an operator to observe said superimposed view along said predetermined path for purposes of making said adjustments to obtain alignment, and means for lowering said component support means vertically along said z-axis to place a said electrical component into surface contact with the pad members of a said printed circuit board with which it has been aligned for soldering purposes, the improvement which comprises an adjustable polarizing filter positioned horizontally across said z-axis, between said component support means and said carriage member, for filtering the light reflected image of said pad members of a printed circuit board and which is rotatable for adjusting the contrast of said image to produce a greater visual distinction between the leads of said electrical component and the pad members of said printed circuit board.

8. An apparatus according to claim 7 in which said polarizing filter comprises an element of said beam splitter cube.

9. An apparatus according to claim 8 in which said polarizing filter is rotatably mounted in said beam splitter cube at a location below said predetermined light path for purposes of filtering the light reflected view of the pad members of a said printed circuit board.

10. An apparatus according to claim 7 characterized by said beam splitter cube having thereon light means surrounding said z-axis for directly illuminating a said electrical component and/or the pad members on a said printed circuit board.

11. An apparatus according to claim 10 in which said light means comprise banks of fiber optic light means above and below said predetermined light path for directly illuminating both said component and said pad members.

12. An apparatus according to claim 7 characterized by said beam splitter cube incorporating at the upper portion thereof and across said z-axis a position-sensing means for sensing the alignment position of a said electrical component relative to said beam splitter cube and producing a sensible indication thereof.

13. An apparatus according to claim 12 in which said sensing means comprises an electric eye means associated with an indicator light means.

* * * * *